United States Patent [19]
Kuno et al.

[11] 3,986,153
[45] Oct. 12, 1976

[54] ACTIVE MILLIMETER-WAVE INTEGRATED CIRCUIT

[75] Inventors: Hiromu John Kuno, Palos Verdes Peninsula; Yu-Wen Chang, Los Alamitos; Mario Siracusa, Fountain Valley, all of Calif.

[73] Assignee: Hughes Aircraft Company, Culver City, Calif.

[22] Filed: Nov. 17, 1975

[21] Appl. No.: 632,613

Related U.S. Application Data

[63] Continuation-in-part of Ser. No. 502,595, Sept. 3, 1974, abandoned.

[52] U.S. Cl. .............................. 333/84 R; 330/34; 330/53; 331/96; 331/107 R; 331/107 G
[51] Int. Cl.² ...................... H01P 3/16; H03B 7/14; H03F 3/60
[58] Field of Search ...................... 333/84 R, 84 M; 330/4.9, 5, 34, 53; 331/96, 107 G, 107 R

[56] References Cited
UNITED STATES PATENTS

| | | |
|---|---|---|
| 3,553,610 | 1/1971 | Brenner et al. ............... 333/98 R X |
| 3,665,339 | 5/1972 | Liu ............................... 333/84 M X |
| 3,668,553 | 6/1972 | Dunn et al. .................. 333/84 M X |
| 3,680,002 | 7/1972 | Quine ........................... 333/84 M X |
| 3,721,918 | 3/1973 | Rosen et al. ................. 333/84 M X |
| 3,757,259 | 9/1973 | Jones et al. ..................... 333/84 M |
| 3,769,618 | 10/1973 | Freedman et al. ............ 333/95 R X |
| 3,786,375 | 1/1974 | Sato et al. ......................... 333/84 M |
| 3,857,115 | 12/1974 | Wisbey ......................... 333/98 R X |

*Primary Examiner*—Paul L. Gensler
*Attorney, Agent, or Firm*—William J. Bethurum; W. H. MacAllister

[57] ABSTRACT

An active millimeter wave integrated circuit including a thin non-metallic waveguiding layer mounted on an image plane and having an opening therein which exposes a given area of the image plane. An active solid state device, such as a millimeter wave diode, is mounted on the exposed area of the image plane, and millimeter wave energy is coupled to and from the device into the waveguiding layer by way of both a metallic ribbon (or wire) bonded to the active device and a connecting metallization pattern atop the waveguiding layer. This metallization pattern may assume various geometries corresponding to functional components such as low-pass filters, resonators, stepped or tapered metallized transitions, and the like, and also provides the desired impedance matching and efficient energy coupling between the active device and the waveguiding layer.

A DC operating bias can be applied to the device by connecting one power supply terminal to the metallization pattern and one power supply terminal to the ground or image plane. The image plane also serves as an excellent solid mechanical support and heat sink for the integrated circuit.

8 Claims, 8 Drawing Figures

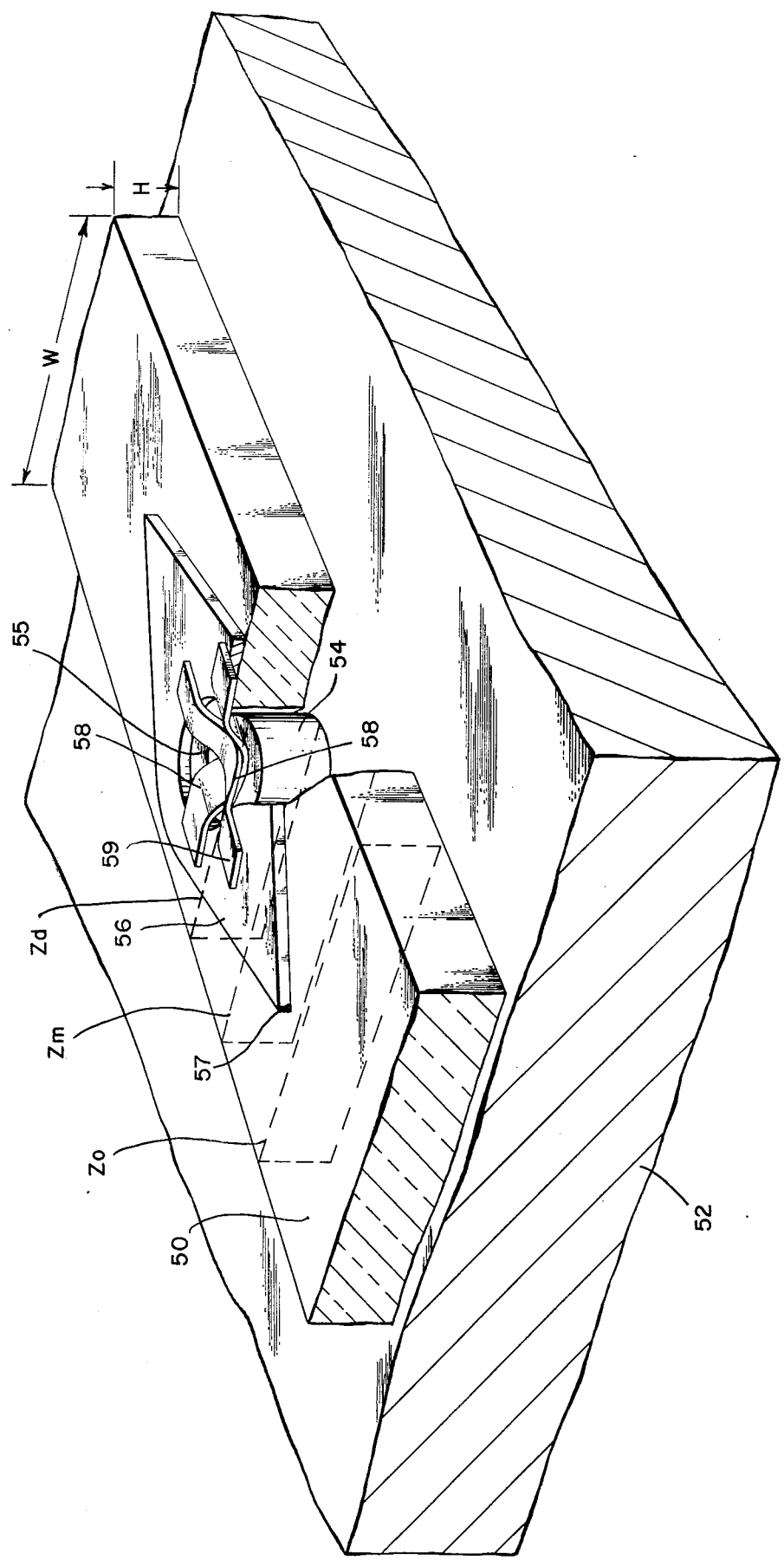

ACTIVE MILLIMETER-WAVE INTEGRATED CIRCUIT

This is a continuation-in-part of our pending application Ser. No. 502,595, filed Sept. 3, 1974 now abandoned.

FIELD OF THE INVENTION

This invention relates generally to millimeter wave integrated circuits and more particularly to an active millimeter wave integrated circuit such as an amplifier, oscillator or modulator, featuring improved energy coupling between the active device and the waveguide of the circuit.

BACKGROUND OF THE INVENTION

In recent years there has been substantial interest in millimeter wave semiconductor devices and integrated circuits, and such interest has been enhanced with recent and substantial advances in solid state microwave and millimeter wave diodes which are utilized in a wide variety of power generation, control, and signal processing functions. For example, the frequency-power product of impact ionization avalanche transit time (IMPATT) diodes has been greatly improved in just the past year, and these devices have been successfully operated at frequencies in excess of 140 GHz and at a power output in excess of 120 milliwatts per device. This frequency is about midway in the millimeter wave frequency range, which is generally considered between 30 and 300 GHz, corresponding respectively to wavelengths of 10 mm and 1 mm.

In addition to the rising interest in IMPATT diodes, the well known bulk effect Gunn diode has also received many operational improvements and wide use in recent years, especially in relatively low noise applications in contrast to the higher power applications in which IMPATT diodes have been used.

Some of the millimeter wave applications for these devices include millimeter wave sweep generators, parametric amplifier pumps using stabilized IMPATT oscillators, doppler radar for intrusion alarm systems, aircraft landing systems, and collision aviodance networks, to mention a few.

PRIOR ART

In many of the above, as well as other millimeter wave circuits and system applications, it is desirable from the standpoint of cost, size, and weight to construct the active millimeter wave device together with its associated waveguide coupling member in the smallest possible micro-miniaturized form without sacrificing realiability or performance in the process. We know of at least three prior art approaches utilized for such purpose of combining an active millimeter wave diode with its associated millimeter wave coupling means in a small package. A first approach is to utilize a thin layer of high resistivity silicon for the waveguide coupling medium and to fabricate the diode's active PN junction regions directly in a chosen portion of this high resistivity layer, such as by ion implantation doping or solid state diffusion. One example of this approach may be found in an article by H. Jacobs and M. M. Chrepta entitled "Semiconductor Dielectric Waveguides for Millimeter Wave Functional Circuits," 1973 IEEE G-MTT International Microwave Symposium, pgs. 28–29, University of Colorado, June 4–6, 1973.

A second such prior art millimeter wave coupling approach is to utilize a so called dielectric waveguide (also referred to in the art as an image guide) consisting of a strip of dielectric material and having a rectangular cross section for coupling to and from an adjacent microwave or millimeter wave diode. This diode may be mounted, for example, in a coaxial biasing circuit in which a DC bias pin for the diode is also an inner coaxial member of a bias or tuning circuit and provides the necessary DC operating bias for the diode. Conventional inductive coupling techniques may be utilized to couple energy from this coaxial circuit arrangement into the dielectric waveguide.

A third approach known to us for coupling energy from a microwave or millimeter wave diode into an adjoining waveguide member utilizes a tapered waveguide section for interconnecting a conventional dielectric waveguide of rectangular cross section to a hollow metal waveguide, also of standard rectangular configuration. In this approach, the diode is mounted in the hollow metal waveguide, and energy is coupled from the diode and through the tapered waveguide section into the dielectric waveguide member.

While the above three approaches have proven to be satisfactory for certain individual microwave and millimeter wave circuit applications, none of these three approaches is capable of utilizing state-of-the-art millimeter wave diodes in a very small and composite layered millimeter wave integrated circuit structure in which the device-to-waveguide coupling is achieved with: (1) a maximum of efficiency, reliability and performance, (2) a maximum of fabrication simplicity and (3) a minimum of size, cost and weight.

THE INVENTION

The general purpose of this invention is to provide a novel alternative approach to the above prior art millimeter waveguide coupling techniques and one which may be utilized to fabricate a novel active millimeter wave integrated circuit featuring vastly improved device-to-waveguide coupling efficiency. To accomplish this purpose, we have constructed an active millimeter wave integrated circuit including a metal ground or image plane to which a suitable non-metallic waveguiding layer of predetermined thickness and width has been bonded. The waveguiding layer may be constructed from high resistivity silicon or gallium arsenide or from selected ceramics, for example. The waveguiding layer has an opening therein which exposes a chosen surface area of the image plane, and a millimeter wave active device is mounted in this opening and firmly bonded to the exposed area of the image plane. A chosen metallization pattern is formed atop the waveguiding layer, so as to provide energy coupling and impedance matching between the millimeter-wave active device and the non-metallic waveguiding layer.

The millimeter wave active device is directly coupled to the waveguiding layer by means of a metallic ribbon or wire which also provides a necessary DC bias connection from an external power supply, through the active device and through the image plane which is the DC return path to the power supply. Therefore, the image plane and the metallization pattern atop the waveguiding layer provide the function of supplying DC bias to the active device of the circuit in addition to providing their other normal waveguide circuit functions as described above. Furthermore, the image plane provides an excellent mechanical support for the millimeter wave active device and the waveguiding layer, both during integrated circuit fabrication and in the normal utilization of the structure. And, the metal image plane provides an excellent heat sink for the millimeter wave active device during its normal circuit operation.

Thus, a millimeter wave diode, such as an IMPATT diode, can be directly bonded to the image plane and directly coupled into the waveguiding layer without the requirement for tapered waveguide-to-dielectric transitions, without the requirement for coaxial-to-waveguide circuit couplings or without the requirement for a doping process wherein PN junctions are directly fabricated in a semiconductor waveguiding layer. Obviously, this feature is most advantageous from the standpoint of being able to use off-the-shelf, discrete component state-of-the-art microwave and millimeter wave diodes. These diodes may be directly bonded to the image plane of the structure to insure good device reliability and performance.

Accordingly, an object of the present invention is to provide a new and improved active millimeter wave integrated circuit.

Another object is to provide an integrated circuit of the type described which is relatively economical in its fabrication and reliable and durable in its operation.

Another object is to provide a millimeter wave integrated circuit of the type described wherein various individual elements of the novel circuit combination provide two or more circuit functions, as will be further described.

Another object is to provide a millimeter wave integrated circuit of the type described which features improved heat sinking characteristics.

Another object is to provide a millimeter wave integrated circuit of the type described wherein the device-to-waveguide mechanical and electrical coupling is vastly simplified relative to corresponding state-of-the-art device-to-waveguide coupling techniques.

Another object is to provide an integrated circuit of the type described wherein the device-to-waveguide coupling efficiency is maximized.

These and other objects and features of the invention will become more fully apparent in the following description of the accompanying drawings.

DESCRIPTION OF THE DRAWINGS

FIG. 2b is an enlarged view of an IMPATT diode package utilized in the integrated structure of FIG. 2a.

FIG. 7 is a partially cut-away perspective view of the completed integrated circuit to illustrate the energy coupling and impedance matching characteristics of the tapered metallization pattern shown schematically in FIG. 4.

Referring now to FIG 1, there is shown a non-metallic waveguiding member 10, which in a preferred embodiment of the invention is a sheet of high resistivity single crystal silicon, typically in excess of about 1000 ohm centimeters. However, this layer 10 may be GaAs, or another suitable semiconductor material, or even a dielectric material, such as a ceramic. This sheet or layer 10 is bonded to a high conductivity metal image plane 12, which may be copper or aluminum or another suitable high conductivity metal sheet and which is also referred to alternatively herein as a ground plane. This bonding may be achieved using conventional solders or epoxy materials.

The waveguiding layer 10 is typically on the order of 10 to 20 mils in thickness and the exact height and width dimensions of the layer 10 depend upon the dielectric constant of the waveguiding and and frequency and propagation mode of the guided wave. The layer 10 has an opening 14 therein which exposes a predetermined area (not shown) of the image plane 12. A thin metallic pattern 16, such as Chrome-Gold, has been deposited as shown on the upper surface of the silicon layer 10, and conventional Chrome-Gold (Cr:Au) evaporation techniques may be utilized in the deposition of the metallic pattern 16 closely adjacent the opening 14 in the waveguiding layer 10. As will be seen hereinafter, the metallic pattern 16 may assume any one of a number of well-known two dimensional geometrical patterns or configurations on the surface of the waveguiding layer 10. These patterns or configurations will functionally alter the wave propagation within the waveguiding layer 10 in a predetermined manner and provide efficient coupling and impedance matching between the waveguiding layer 10 an an active device package (not shown) which is subsequently mounted on and bonded to the area of the image plane 12 which is exposed by opening 14.

Figure 2A:
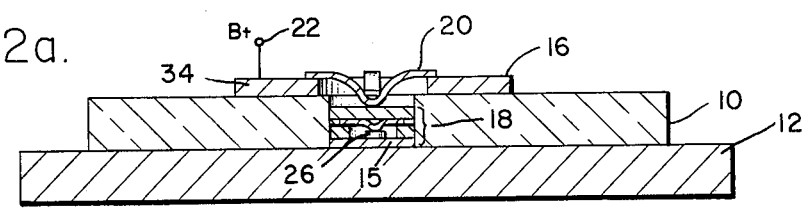
FIG. 2a illustrates, in schematic cross section, the connection of an active millimeter wave device in the opening of the composite structure of FIG. 1.

Referring now to FIG. 2a, a millimeter wave active device package 18 is firmly bonded directly to the exposed surface region 15 of the image plane 12. The millimeter wave active device 26 of this package may be one of a large number of off-the-shelf, state of the art millimeter wave components such as an IMPATT diode, a Gunn diode, a PIN diode, a varactor diode or other millimeter wave diode, all of which are individually well-known in the art and which provide the well-known functions of oscillation, amplification, detection, or modulation of the millimeter waves which are propagated in the waveguiding layer 10. In the illustrative embodiment of the invention shown in FIG. 2a, the package 18 is a complete IMPATT diode package which is electrically connected via a gold ribbon 20 and through the metallization layer 16 to a DC bias terminal 22. The operating DC bias for this package is applied via terminal 22, the metal strip 16, the gold ribbon 20, through the diode 26 and, finally, through the image plane 12 which serves as the DC return path for the B$^+$ power supply to which terminal 22 is connected.

Figure 2B:
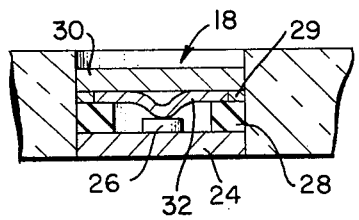

Referring now to FIG. 2b, there is shown an enlarged schematic diagram of the IMPATT diode package 18 which will typically include a copper base member 24 to which is firmly bonded a small IMPATT diode 26. A metallized quartz ring 28 is also bonded as shown to the peripheral surface regions of the copper base member 24, and a solder preform 29 is wedged between the quartz ring 28 and a molybdenum cap 30. A gold ribbon 32 is press fit as shown between the upper surface of the diode 26 and the lower surface of the molybdenum cap 30, and the outer edges of the gold ribbon 32 are wedged securely between the cap 30 and the upper surfaces of the metallized quartz ring 28. Thus, the previously described larger gold ribbon 20 provides the DC operating bias for the IMPATT diode 26 via the molybdenum cap 30 and via the smaller, inner gold ribbon 32 as shown.

The bonding of the copper base 24 of the IMPATT diode package 18 directly to the image plane 12 provides a good solid mechanical support for the diode package 18 as well as an excellent heat sink for the heat generated by the diode 26. The heat passes through the copper base member 24 and into the the much wider area image plane 12 of the structure.

Figure 1:
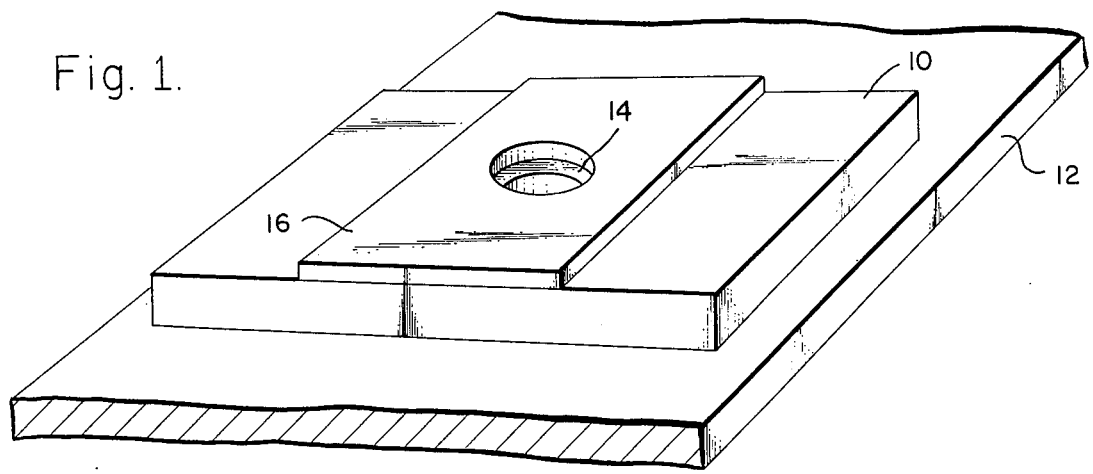
FIG. 1 illustrates, in perspective view, a partially completed millimeter wave integrated circuit according to the present invention.

Although the waveguiding layer 10 may be either semiconducting or insulating, it is generally known in this art as a "dielectric waveguide" and supports and confines the propagation of electromagnetic energy throughout its entire cross-sectional area and without regard to the geometry of any surface metallization pattern 16 that may be adherent to its top surface. For example, the selected surface metallization pattern 16 and ribbon 20 described above are utilized in combination with the waveguiding layer 10 for the purposes of impedance matching, energy coupling and DC biasing between the layer 10 and the solid state active device 26. But this surface metallization pattern 16 provides no confinement of microwave energy beneath the metallization surface as in the case of the stipline, microstrip, or microguide type of transmission lines shown, for example, in FIGS. 1(a) and 1(b) of U.S. Pat. No. 3,903,488 assigned to the present assignee. Contrariwise, the waveguiding layer 10 of the present invention is the type shown in FIG. 1(c) of the above U.S. Pat. No. 3,903,488 or the type disclosed, for example, in the classical reference by S. P. Schlesinger and D. D. King entitled "Dielectric Image Lines," *IRE Transactions on Microwave Theory and Techniques*, July 1958, pp 291-299. Furthermore, the present invention is obviously not limited to the particular above semiconductive material, i.e., silicon, in the construction of the waveguiding layer 10 and, instead, the layer 10 may be constructed from a variety of dielectric (insulating) materials such as alumina ($Al_2O_3$), quartz, Teflon, silicon dioxide ($SiO_2$) or the like.

Figure 3:
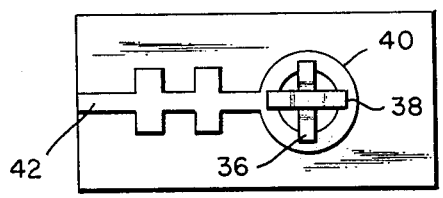
FIGS. 3, 4, 5 and 6 illustrate, respectively, four pattern geometries for the metallization layer which may be formed atop the waveguiding layer in FIG. 2a. These geometries are utilized to provide four microwave integrated circuit (MIC) functions as will be further described.

Referring now to FIGS. 3 through 6, there are shown various metallization patterns atop the waveguiding layer 10 for performing predetermined functions for the waveguiding structure previously described. These metallization patterns may be utilized in various selected geometrical configurations on the upper surface of the waveguiding layer 10. In each case, however, a metallic gold ribbon 20 will be directly and electrically connected as shown between the diode package 18 and an adjacent edge 34 of the metallization pattern 16 as shown in FIG. 2a. In FIG. 3, for example, there are shown two metallic ribbons 36 and 38 which are bonded to each other at right angles and extend from the diode package up into secure electrical contact at four separate locations on the metallized film resonator 40. The H-shaped metallized film resonator 40 shown in FIG. 3 provides low pass filtering for the millimeter waves which are propagated between the diode package 18 and the port 42 in FIG. 3.

Figure 4:
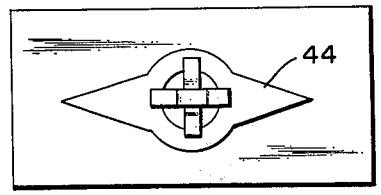
Figure 5:
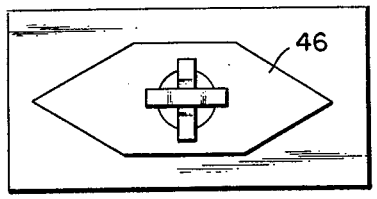
Figure 6:
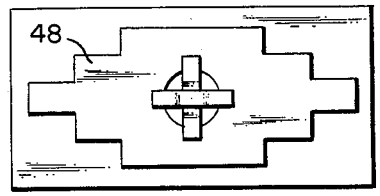

The various metallized film patterns 44, 46 and 48 shown in FIGS. 4, 5 and 6 respectively represent some of the possible surface metallization configurations which may be used to match the impedance of the active devices, e.g., an IMPATT diode, and the waveguiding layer. Furthermore, these patterns serve to minimize the insertion loss of the active devices when energy propagates through devices such as a PIN diode modulator or switch, or frequency multipliers using devices such as varactor diodes.

The insertion loss in the waveguide circuit is minimized as a result of the smooth transition in waveguide impedance provided by the circular or tapered metallization patterns shown in FIGS. 3 through 6. These metallization patterns provide this smooth impedance transition between the relatively high impedance of the waveguide and the relatively low impedance of the semiconductor active device which is mounted on the image plane. Thus, the metallization patterns shown in FIGS. 3 through 6 function somewhat like an antenna by coupling energy from the semiconductor active device to the adjacent dielectric image guide at a maximum coupling efficiency resulting from the above impedance match.

Referring now to FIG. 7, there is shown, in a partially cut-away perspective view, the integrated circuit structure of the invention utilizing the tapered metallization pattern of the type shown in FIG. 4. The infinite-length waveguide 50 in FIG. 7 is of predetermined height H and width W and is mounted on an infinite area image plane 52. A cylindrical solid state active device package 54 is mounted as shown within an opening 55 in the dielectric guide 50 and on the upper surface of the image plane 52. A tapered metallization impedance transition pattern 56 is bonded as shown to the upper surface of the waveguide 50 and is DC connected to the active device package 54 by means of two gold ribbons 58 and 59 in the same manner as previously described above with reference to FIG. 2a.

The impedance $Z_0$ of the dielectric guide 50 is substantially greater than the impedance $Z_d$ of the active device package. For this reason, the impedance $Z_m$ of the portion of the waveguide 50 beneath the metallization pattern 56 decreases as the metallization surface area increases, proceeding from the tip 57 of the metallization pattern 56 towards the device package 54. Thus, the tapered metallization pattern 56 provides the above described smooth impedance transition in the structure necessary for minimizing the insertion losses therein and maximizing energy coupling between the device package 54 and the waveguide 50. The H and W dimensions of the rectangular cross-section of the dielectric image guide 50 control the mode and frequency of wave propagation in the waveguide, as previously mentioned.

A wide range of suitable semiconducting and dielectric materials may be used, as previously noted, for the waveguiding layer 50. Additionally, the image plane 52 may be fabricated of copper or other suitable heat sinking materials, whereas the metallization pattern 56 may be evaporated aluminum, gold tungsten, titanium or other metals suitable for deposition on the surface of the waveguiding layer 50 using known metal deposition systems for these metals.

What is claimed is:
1. A millimeter wave integrated circuit comprising:
   a. an image plane,
   b. a layer of non-metallic waveguiding material formed atop said image plane and having a predetermined width and thickness and also having an opening therein exposing a predetermined area of said image plane, c. a solid state device mounted within said opening of said waveguiding layer for coupling energy to or from said waveguiding layer, d. a metallization pattern of predetermined geometrical configuration formed atop said waveguiding layer for providing an impedance transition region between remote regions of said waveguiding layer and said solid state device, and e. DC bias connection means connected between said solid state device and said metallization pattern for both coupling energy between said device and said waveguiding layer and for providing a DC bias to said device via said metallization pattern and through said image plane, whereby efficient energy coupling is provided between said solid state device and said waveguiding layer, and said image plane provides excellent mechanical and thermal properties for said integrated circuit.

2. The structure defined in claim 1 wherein said non-metallic waveguiding layer is a layer of high resistivity silicon having a resistivity in excess of about 1000 ohm-centimeters.

3. The structure defined in claim 1 wherein said solid state device is a millimeter wave impact avalanche transit time (IMPATT) diode.

4. The structure defined in claim 1 wherein said DC bias connection means includes a metal ribbon-like member which is serially connected between said solid state device and said metallization pattern.

5. The structure defined in claim 2 wherein said solid state device is a two terminal diode operable at millimeter wave frequencies.

6. The structure defined in claim 3 wherein said non-metallic waveguiding layer is a layer of high resistivity silicon having a resistivity in excess of about 1000 ohm-centimeters.

7. A millimeter wave integrated circuit comprising:

a. a conductive image plane, b. an image guide of non-metallic waveguiding material disposed on one surface of said image plane and having a predetermined width and height which controls the mode of propagation and frequency of electromagnetic waves which propagate throughout the entire cross-sectional area of said guide and from point to point along the length thereof extending along a predetermined path on the surface of said image plane, said image guide having an opening therein which exposes a predetermined area of said image plane, c. a relatively low impedance solid state device mounted within said opening of said image guide and atop said exposed area of said image plane for coupling energy to or from said image guide, d. a metallization pattern of predetermined geometrical configuration formed at a selected location on the top surface of said image guide for providing an impedance transition region in said image guide between the relatively high impedance at remote locations of said image guide and the relatively low impedance of said solid state device, and e. electrical connection means interconnected between said solid state device and said metallization pattern for coupling energy between said device and said image guide and also for providing a DC bias connection path to said solid state device, whereby efficient energy coupling is provided between said solid state device and said image guide, and said image plane provides both a DC return path for DC bias applied to said solid state device as well as a heat sink having good mechanical and thermal properties for said solid state device.

8. The structure defined in claim 7 wherein said electrical connection means includes a metal ribbon like member which is electrically connected between said solid state device and said metallization pattern.

* * * * *